United States Patent
Pallotta (10) Patent No.: US 11,171,600 B2
(45) Date of Patent: Nov. 9, 2021

(54) DEVICE AND METHOD FOR VOLTAGE CONTROLLED OSCILLATOR COMPRISING DISTRIBUTED ACTIVE TRANSFORMER CORES

(71) Applicant: STMicroelectronics S.r.l., Agrate Brianza (IT)

(72) Inventor: Andrea Pallotta, Rho (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/937,071

(22) Filed: Jul. 23, 2020

(65) Prior Publication Data

US 2021/0036659 A1  Feb. 4, 2021

(30) Foreign Application Priority Data

Jul. 29, 2019  (FR) ...................................... 1908586

(51) Int. Cl.
| | |
|---|---|
| H03F 3/26 | (2006.01) |
| H03B 5/12 | (2006.01) |
| H03L 7/00 | (2006.01) |
| H03F 3/45 | (2006.01) |
| H04B 1/00 | (2006.01) |
| H01Q 23/00 | (2006.01) |
| H04B 1/40 | (2015.01) |

(52) U.S. Cl.
CPC ........... *H03B 5/1212* (2013.01); *H01Q 23/00* (2013.01); *H03F 3/45475* (2013.01); *H04B 1/40* (2013.01); *H03B 2200/009* (2013.01)

(58) Field of Classification Search
None
See application file for complete search history.

(56) References Cited

U.S. PATENT DOCUMENTS

| | | | | |
|---|---|---|---|---|
| 6,891,444 | B2 * | 5/2005 | Jacobsson | ............ H03B 5/1231 331/117 R |
| 7,471,153 | B2 * | 12/2008 | Kee | ......................... H03F 3/604 330/295 |
| 7,646,249 | B2 * | 1/2010 | Hajimiri | ............... H03F 3/2176 330/297 |
| 7,733,183 | B2 * | 6/2010 | Komijani | ................ H03F 1/223 330/276 |
| 7,847,667 | B2 * | 12/2010 | Kinget | ................ H01L 27/0727 336/200 |
| 8,049,563 | B2 * | 11/2011 | Aoki | ....................... H03F 1/223 330/276 |
| 8,049,564 | B2 * | 11/2011 | Pallotta | ............... H03F 3/45179 330/276 |
| 8,183,948 | B2 * | 5/2012 | Ainspan | ............... H03B 5/1212 331/167 |

(Continued)

FOREIGN PATENT DOCUMENTS

EP  3416284 A1  12/2018

OTHER PUBLICATIONS

Tohidian, M. et al., "Dual-Core High-Swing Class-C Oscillator with Ultra-Low Phase Noise," IEEE Radio Frequency Integrated Circuits Symposium (RFIC), Jun. 2-4, 2013, 4 pages.

*Primary Examiner* — Pablo N Tran
(74) *Attorney, Agent, or Firm* — Slater Matsil, LLP (57) ABSTRACT

The present disclosure relates to a voltage controlled oscillator comprising a plurality of oscillator cores magnetically coupled in series.

20 Claims, 5 Drawing Sheets

(56) References Cited

U.S. PATENT DOCUMENTS

| | | | |
|---|---|---|---|
| 8,558,625 B1* | 10/2013 | Lie .................. | H03B 5/1215 |
| | | | 331/50 |
| 8,797,105 B2* | 8/2014 | Afshari .............. | H03B 28/00 |
| | | | 331/46 |
| 9,356,556 B1* | 5/2016 | Raj .................. | H03B 5/1215 |
| 9,559,667 B1* | 1/2017 | Chakrabarti ........ | H03B 5/1265 |
| 9,667,192 B2 | 5/2017 | Iotti et al. | |
| 9,831,830 B2* | 11/2017 | Valdes Garcia ..... | H03B 5/1215 |
| 2002/0135422 A1* | 9/2002 | Aoki ................ | H03F 3/604 |
| | | | 330/276 |
| 2004/0124931 A1 | 7/2004 | Hajimiri et al. | |
| 2008/0284534 A1* | 11/2008 | El Rai .............. | H03B 5/1215 |
| | | | 331/117 FE |
| 2012/0169426 A1* | 7/2012 | Chataigner ........ | H03B 5/1262 |
| | | | 331/46 |
| 2013/0120074 A1* | 5/2013 | Zuo ................ | H03B 5/1262 |
| | | | 331/116 FE |
| 2014/0070898 A1 | 3/2014 | Shirinfar et al. | |

\* cited by examiner

DEVICE AND METHOD FOR VOLTAGE CONTROLLED OSCILLATOR COMPRISING DISTRIBUTED ACTIVE TRANSFORMER CORES

CROSS-REFERENCE TO RELATED APPLICATIONS

This application claims the benefit of French Application No. 1908586, filed on Jul. 29, 2019, which application is hereby incorporated herein by reference.

TECHNICAL FIELD

The present disclosure relates generally to the field of voltage controlled oscillators (VCOs), and in particular to a distributed active transformer VCO.

BACKGROUND

Radio frequency wireless communications generally rely on VCOs for implementing the local oscillator at the transmitter and/or receiver, for example for generating carrier frequencies, clock generation, bit recovery, etc. The high growth in wireless communications, and the scarcity and license cost of reserving portions of the frequency spectrum, has increased the demand for the number of available frequency channels, particularly for mobile communications. This demand imposes increasingly stringent requirements on the amount of phase noise of the local oscillators. Indeed, phase noise strongly limits the frequency spectral efficiency of the communications over a wireless link.

Furthermore, the importance of reducing phase noise in voltage controlled oscillators is not limited to the field of wireless communications, but is also pertinent in other fields such as integrated circuit clock generation, and also for sensing and radar applications.

Phase noise generally corresponds to short term random frequency fluctuations of the sinusoidal waveform generated by the VCO.

There is a need in the art for a VCO that can be implemented using silicon-based semiconductor technology, such as complementary metal-oxide-semiconductor (CMOS) or bipolar CMOS (BiCMOS) technology, and which has relatively low phase noise.

SUMMARY

It is an aim of embodiments described herein to at least partially address one or needs in the prior art.

According to one embodiment, there is provided a voltage controlled oscillator comprising a plurality of oscillator cores magnetically coupled in series. For example, the oscillator cores are coupled in series by electromagnetic induction, also known as inductive coupling, for example via a common inductive loop. For example, each oscillator core comprises first and second inductive portions, the first and second inductive portions of each of the oscillator cores being magnetically coupled to a common inductive loop, a first end of each of the first and second conductive portions being coupled to an excitation circuit of the oscillator core, and a second end of each of the first and second conductive portions being coupled to a voltage supply rail.

According to one embodiment, the plurality of oscillator cores comprises M oscillator cores, with M equal to 4 or more.

According to one embodiment, each oscillator core comprises first and second inductive portions, the first and second inductive portions of each of the oscillator cores being magnetically coupled to a common inductive loop.

According to one embodiment, the voltage controlled oscillator further comprises a first output line coupled to one end of the common inductive loop and a second output line coupled to the other end of the common inductive loop.

According to one embodiment, the common inductive loop forms a regular polygon shape having at least four sides, and the first and second inductive portions are positioned adjacent to the sides of the common inductive loop.

According to one embodiment, the oscillator core has its first inductive portion positioned adjacent to a first side of the common inductive loop and its second inductive portion positioned adjacent to a second side of the common inductive loop, a first end of each of the first and second conductive portions being coupled to an excitation circuit of the oscillator core.

According to one embodiment, the common inductive loop comprises: a common mode voltage connection at a mid-point along a first of its sides or at a vertex between two of the sides; and the first and second differential output lines coupled to a second of its sides opposite to the first side.

According to one embodiment, each oscillator core comprises a varactor and a differential amplifier having a first output node coupled to one end of the first inductive portion and a second output node coupled to one end of the second inductive portion, the varactor being coupled between the first and second output nodes.

According to one embodiment, each oscillator core is capable of being selectively activated.

According to a further aspect, there is provided a communications device comprising: an antenna circuit for driving one or more antennas; and the above voltage controlled oscillator.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to a VCO as orientated during normal use.

Unless specified otherwise, the expressions "around", "approximately", "substantially" and "in the order of" signify within 10%, and preferably within 5%.

It has been proposed to reduce phase noise in a VCO by coupling several oscillator cores in parallel with each other. Indeed, the phase noise of a VCO has been shown to be proportional to its resistance, and by providing a plurality of oscillator cores arranged in parallel, this resistance can be reduced. The difficulty, however, is that the parallel coupling of several oscillator cores leads to particularly challenging or even insurmountable layout issues when the number of cores is equal to or greater than four.

Figure 1:
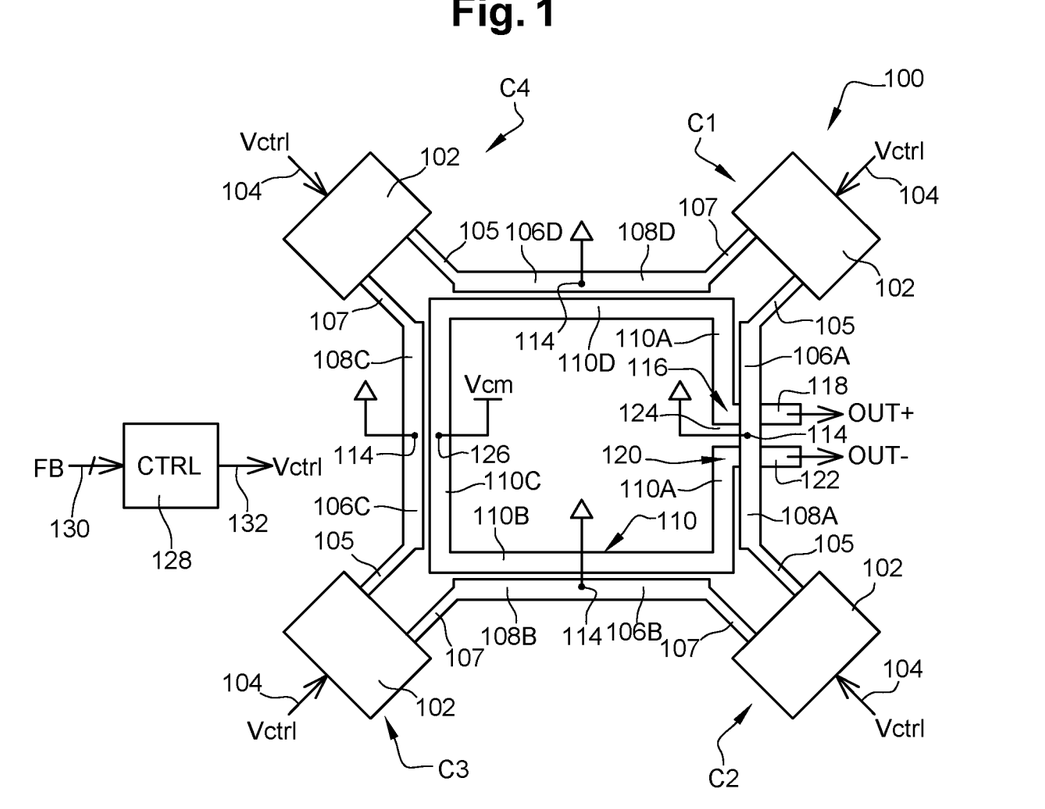
FIG. 1 is a plan view illustrating a VCO according to an example embodiment of the present disclosure.

FIG. 1 is a plan view illustrating a VCO 100 according to an example embodiment of the present disclosure, and based on distributed active transformer series-coupled oscillator cores (SDAT).

The VCO 100 in the example of FIG. 1 comprises four oscillator cores C1, C2, C3 and C4 that are magnetically coupled in series. For example, the oscillator cores are coupled in series by electromagnetic induction, also known as inductive coupling, for example via a common inductive loop.

Each oscillator core for example comprises an excitation circuit 102 receiving a control signal Vctrl on an input line 104, and having outputs 105 and 107. Furthermore, each oscillator core further comprises an inductive portion 106 coupled to the output 105 of the excitation circuit 102, and an inductive portion 108 coupled to the output 107 of the excitation circuit 102. The inductive portions 106, 108 are positioned adjacent to the sides of a common inductive loop 110. Thus, the inductive portions 106, 108 of the oscillator cores are for example arranged to form segments of a primary slab of a one-to-one transformer, and the common inductive loop forms a secondary slab of the one-to-one transformer.

In the example of FIG. 1, the common inductive loop 110 is square shaped, and each oscillator core has its inductive portions 106, 108 formed adjacent to different sides of the inductive loop 110.

For example, an inductive portion 106A of the oscillator core C1 is formed adjacent to a side 110A of the common inductive loop 110, and an inductive portion 108D of the oscillator core C1 is formed adjacent to a side 110D of the common inductive loop 110.

Similarly: an inductive portion 106B of the oscillator core C2 is formed adjacent to a side 110B of the common inductive loop 110, and an inductive portion 108A of the oscillator core C2 is formed adjacent to the side 110A of the common inductive loop 110; an inductive portion 106C of the oscillator core C3 is formed adjacent to a side 110C of the common inductive loop 110, and an inductive portion 108B of the oscillator core C3 is formed adjacent to the side 110B of the common inductive loop 110; and an inductive portion 106D of the oscillator core C4 is formed adjacent to a side 110D of the common inductive loop 110, and an inductive portion 108C of the oscillator core C4 is formed adjacent to the side 110C of the common inductive loop 110.

Each of the inductive portions 106, 108 for example has an inductance in the range 10 to 100 pH, and for example in the range 20 to 30 pH, for an oscillation frequency of around 50 GHz.

Each pair of inductive portions 106A, 108A; 106B, 108B; 106C, 108C; and 106D, 108D, formed adjacent to a same side 110A to 110D of the square-shaped common inductive loop 110 for example has one end coupled to a corresponding excitation circuit 102, and its other end coupled to a supply voltage rail at a point 114, thereby providing a virtual AC ground. In the example of FIG. 1, the points 114 are coupled to the supply voltage rail VDD. In some embodiments, each pair of inductive portions is formed by a continuous strip of conductive track, the ends of each strip being coupled to the corresponding outputs of the excitation circuit 102 of a corresponding oscillator core, and the point 114 for example being the midpoint of each strip, which is for example coupled to the supply rail, such as VDD. Each continuous strip of conductive track forming a pair of the inductive portions 106, 108 for example has a total length of between 50 and 150 μm, and for example of around 80 μm. An advantage of coupling the points 114 to the supply voltage rail is that this provides a simple means for biasing each oscillator core, avoiding the use of DC decoupling capacitors.

The common inductive loop 110 for example comprises a square-shaped strip of conductive track that is continuous except along the side 110A, where it has one end 116 coupled to an output line 118 of the VCO 100, and its other end 120 coupled to an output line 122 of the VCO 100, the output lines 118, 122 respectively providing differential output signals OUT+, OUT− of the VCO 100. The ends 116, 120 of the inductive loop 110 are for example separated from each other by a spacing 124 at around the mid-point of the side 110A of the common inductive loop. Furthermore, a point 126 at around the midpoint of the opposite side 110C of the common inductive loop 110 is for example coupled to a common-mode supply voltage Vcm, which imposes a common-mode level on the differential output signals OUT+, OUT−.

Each of the oscillator cores C1 to C4 for example receives the same control voltage Vctrl, generated by a control circuit (CTRL) 128. For example, the control circuit 128 forms part of a control loop and thus receives a feedback signal FB based on an evaluation of the frequency of the differential output signal OUT+, OUT−, and generates the control voltage Vctrl as a function of this feedback signal FB.

While, in the example of FIG. 1, the excitation circuits 102 of the oscillator cores C1 to C4 are positioned at corners of the square-shaped common inductive loop 110, and the inductive portions 106, 108 are formed adjacent to different sides of the square-shaped common inductive loop 110, other arrangements would be possible, as will now be described with reference to FIG. 7.

Figure 7:
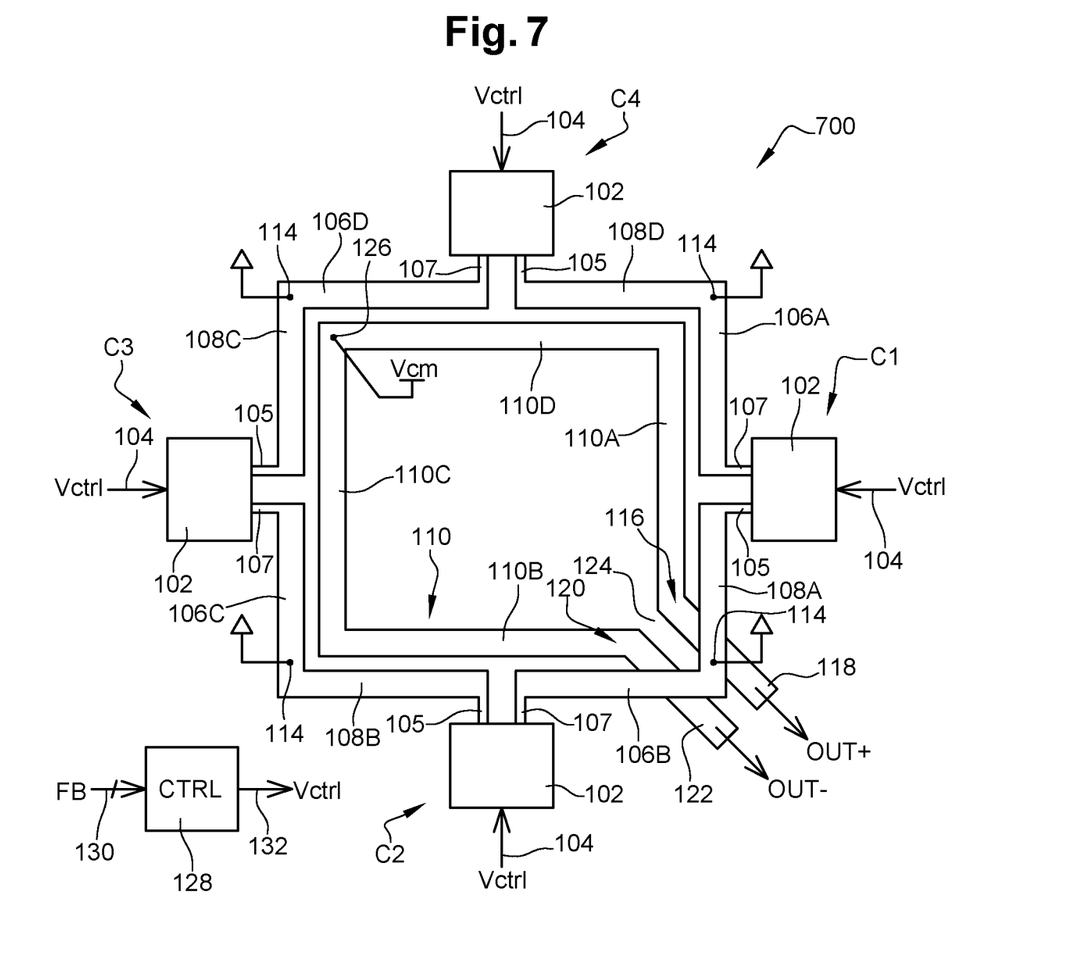
FIG. 7 schematically illustrates a VCO according to a further example embodiment of the present disclosure.

FIG. 7 is a plan view illustrating a VCO 700 according to a further example embodiment of the present disclosure, and based on distributed active transformer series-coupled oscillator cores (SDAT). The VCO 700 has many features in common with the VCO 100 of FIG. 1, and like features have been referenced with like reference numerals and will not be described again in detail. In the VCO 700, the excitation circuits 102 of the oscillator cores C1 to C4 are positioned close to the mid-points of the sides of the square-shaped common inductive loop 110, and the inductive portions 106, 108 of a given oscillator core are formed adjacent to a same side of the square-shaped common inductive loop 110. In this arrangement, the output lines 118, 122 are for example positioned at one corner of the common inductive loop 110, and the common-mode connection 126 is for example positioned at the opposite corner of the common inductive loop 110.

Furthermore, it would be possible to remove one or more oscillator cores in the embodiments of FIGS. 1 and 7. For example, a solution based on just two oscillator cores could be achieved by removing the cores C1 and C2, including their corresponding inductive portions 106A, 108D, 108A and 106B, or by removing the cores C3 and C4, including their corresponding inductive portions 106C, 108B, 108C and 106D.

By providing oscillator cores magnetically coupled in series as shown in FIGS. 1 and 7, the resistances of the cores will be added. However, the phase noise is still reduced. Indeed, it can be shown that phase noise is proportional to the resonance tank resistance and inversely proportional to the square of the amplitude of the output signal. By magnetically coupling a plurality of oscillator cores in series, their oscillations will sum up with each other, increasing the amplitude and allowing the phase noise to be reduced.

Figure 2:
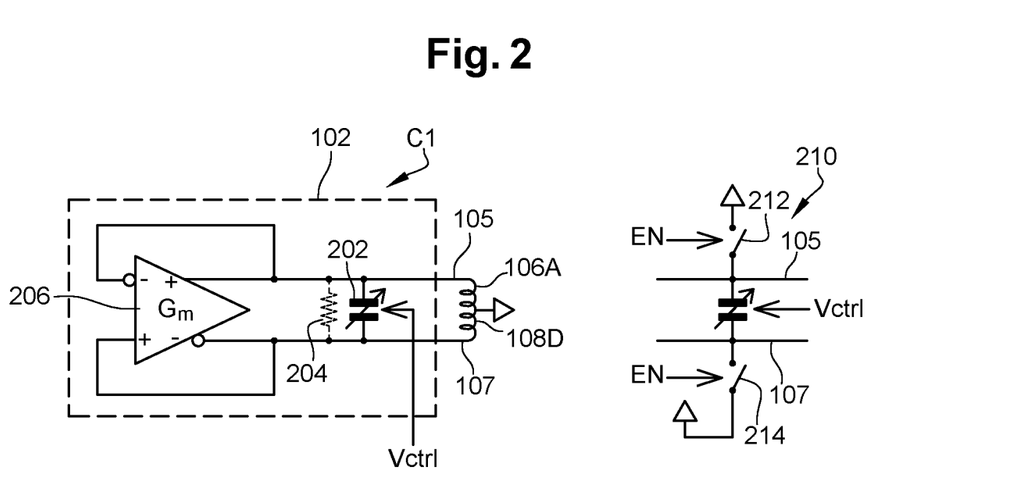
FIG. 2 is a circuit diagram of an oscillator core of FIG. 1 according to an example embodiment.

FIG. 2 is a circuit diagram of the oscillator core C1 of FIGS. 1 and 7 according to an example embodiment. The other oscillator cores C2 to C4 are for example implemented by a similar circuit.

The excitation circuit 102 for example comprises a varactor 202 controlled by the signal Vctrl, which is for example an analog control signal. The varactor 202 is coupled between the output lines 105, 107 of the excitation circuit 102. The circuit 102 also for example comprises a differential amplifier 206 (Gm) having its positive and negative differential outputs coupled to the output lines 105 and 107 respectively. Furthermore, the positive output of the amplifier 206 is coupled to its negative input, and the negative output of the amplifier 206 is coupled to its positive input. A resistor 204 shown by dashed lines in FIG. 2 represents the tank resistance of the oscillator core, the resistances of the cores being presented in series in the embodiments of FIGS. 1 and 7.

While the varactor 202 is shown connected between the output lines 105, 107, according to a variant 210 shown in FIG. 2, the terminals of the varactor 202, i.e. the lines 105, 107, may be short-circuited to VDD via switches 212, 214 respectively coupled between the lines 105, 107 and the VDD supply rail. For example, the switches 212, 214 are implemented by relatively small MOS transistors, and are for example controlled by an enable signal EN, permitting the oscillator core to be selectively activated.

Figure 3:
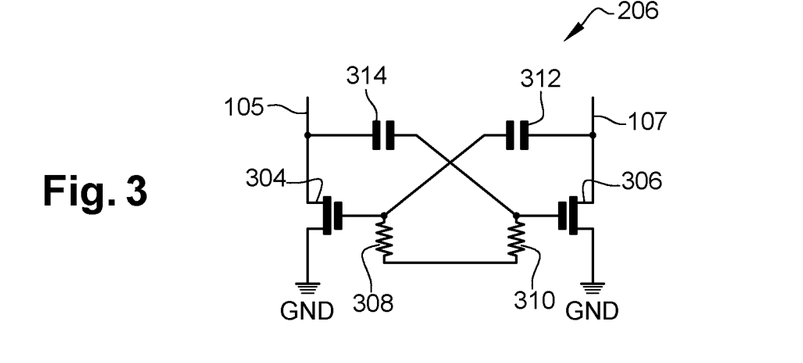
FIG. 3 is a circuit diagram of a differential amplifier, corresponding to a Gm block of the oscillator core of FIG. 2, according to an example embodiment of the present disclosure.

FIG. 3 is a circuit diagram of the differential amplifier 206 of the oscillator core of FIG. 2 according to an example embodiment of the present disclosure. In the example of FIG. 3, the differential amplifier 206 is implemented by a differential pair 304, 306, for example implemented by MOS or bipolar transistors, each coupled via its main current-conducting nodes between the output lines 105, 107 respectively and a ground voltage rail GND. The emitters or sources of the transistors 304, 306 may also be short-circuited to a common node in some embodiments, and the common node connected via a resistor or current source to the ground rail. The control nodes of the transistors 304, 306 are coupled together via resistors 308, 310. Furthermore, the control node of the transistor 304 is for example coupled to the output line 107 via a capacitor 312, and the control node of the transistor 306 is for example coupled to the output line 105 via a capacitor 314.

Of course, FIG. 3 provides merely one example implementation of the differential amplifier 206, there being many alternative circuits that could be used. For example, in alternative embodiments, the capacitors 312 and 314 could be replaced by short-circuits.

While the examples of FIGS. 1 and 7 are based on four oscillator cores, the shape of the common inductive loop can be adapted to more than four oscillator cores, as will now be described in more detail with reference to FIG. 4.

Figure 4:
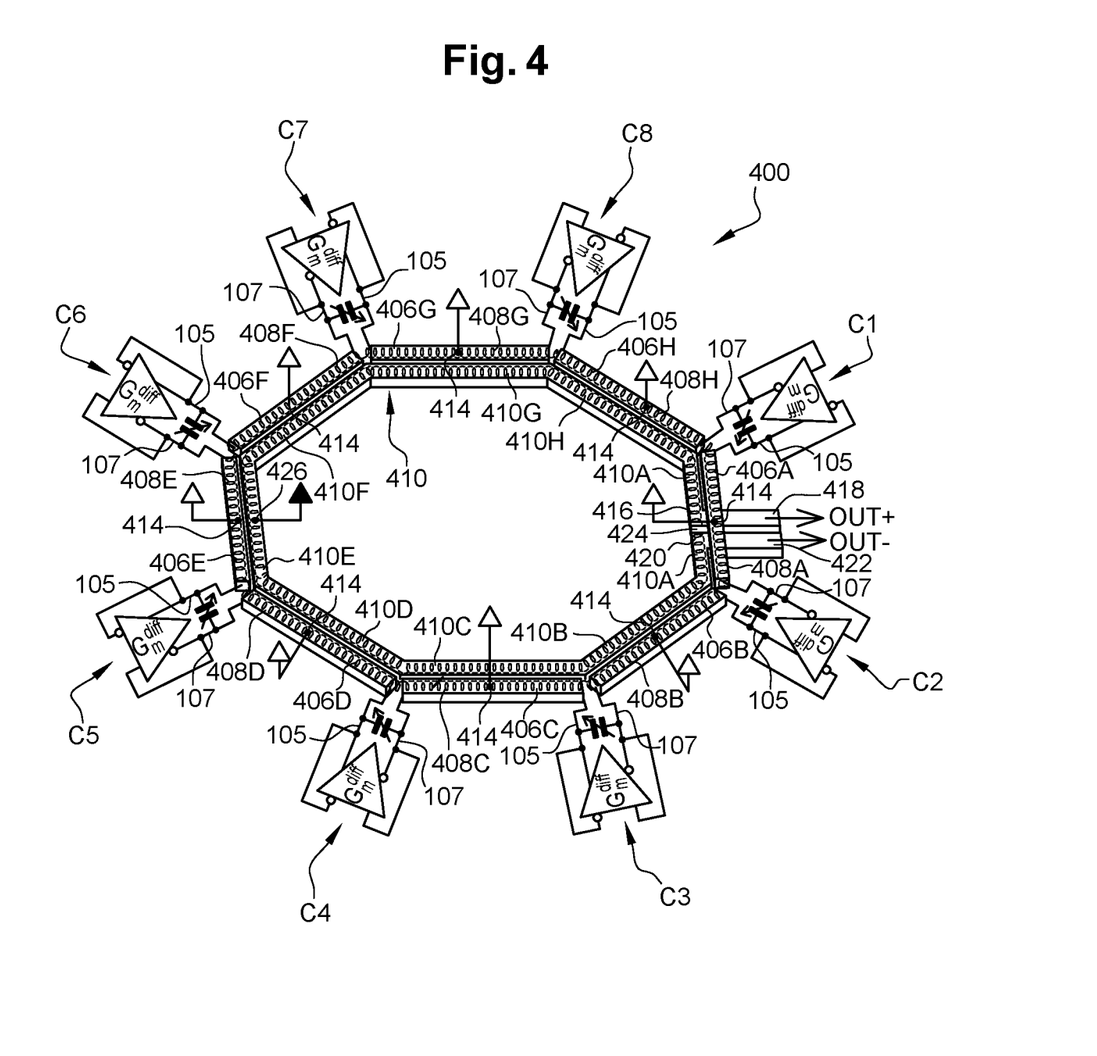
FIG. 4 schematically illustrates a VCO according to a further example embodiment of the present disclosure.

FIG. 4 schematically illustrates a VCO 400 according to a further example embodiment of the present disclosure, again based on distributed active transformer series-coupled oscillator cores (SDAT). The example of FIG. 8 comprises eight oscillator cores C1 to C8 magnetically coupled in series, each oscillator core being implemented by a circuit similar to that of FIG. 2, including the excitation circuit 102. For example, the oscillator cores C1 to C8 are coupled in series by electromagnetic induction, also known as inductive coupling, for example via a common inductive loop.

Each oscillator core C1 to C8 of the VCO 400 has an inductive portion 406 coupled to the output line 105 of the excitation circuit 102, and an inductive portion 408 coupled to the output line 107 of the excitation circuit 102. The inductive portions 406, 408 are positioned adjacent to the sides of a common inductive loop 410.

In the example of FIG. 4, the common inductive loop 410 is octagon shaped, and each oscillator core C1 to C8 has its inductive portions 406, 408 formed adjacent to different sides of the inductive loop 410. Thus, the inductive portions 406, 408 of the oscillator cores are for example arranged to form segments of a primary slab of a one-to-one transformer, and the common inductive loop forms a secondary slab of the one-to-one transformer.

For example, an inductive portion 406A of the oscillator core C1 is formed adjacent to a side 410A of the common inductive loop 410, and an inductive portion 408H of the oscillator core C1 is formed adjacent to a side 410H of the common inductive loop 410. Similarly, the inductive portions 406B to 406H of the oscillator cores C2 to C8 are formed adjacent to sides 410B to 410H respectively of the common inductive loop 410, and the inductive portions 408A to 408G of the oscillator cores C2 to C8 are formed adjacent to the sides 410A to 410G respectively of the common inductive loop 410.

Each of the inductive portions 406, 408 for example has an inductance in the range 10 to 100 pH, and for example 20 to 30 pH, for an oscillation frequency of around 50 GHz.

Each pair of inductive portions 406A, 408A to 406H, 408H, formed adjacent to a same respective side 410A to 410H of the octagon-shaped common inductive loop 410 for example has one end coupled to a corresponding excitation circuit 102, and its other end coupled to a supply voltage rail at a point 414, thereby providing a virtual AC ground. In the example of FIG. 4, the points 414 are coupled to the supply voltage rail VDD. In some embodiments, each pair of inductive portions is formed by continuous strip of conductive track, the ends of each strip being coupled to the corresponding outputs of the corresponding excitation circuits 102 of a corresponding oscillator core, and the point 414 for example being the midpoint of each strip, which is for example coupled to the supply rail, such as VDD. Each continuous strip of conductive track forming a pair of the inductive portions 406, 408 for example has a length of between 50 and 150 μm, and for example of around 80 μm. An advantage of coupling the points 414 to the supply voltage rail is that this provides a simple means for biasing each oscillator core, avoiding the use of DC decoupling capacitors.

The common inductive loop 410 for example comprises an octagon-shaped strip of conductive track that is continuous except along the side 410A, where it has one end 416 coupled to an output line 418 of the VCO 400, and its other end 420 coupled to an output line 422 of the VCO 400, the output lines 418, 422 respectively providing output signals OUT+, OUT− of the VCO 400. The ends 416, 420 of the inductive loop 110 are for example separated from each other by a spacing 424 at around the mid-point of the side 410A of the common inductive loop. Furthermore, a point 426 at around the midpoint of the opposite side 410E of the common inductive loop 410 is for example coupled to a common-mode supply voltage Vcm, which imposes a common-mode level on the differential output signals OUT+, OUT−.

While not shown in FIG. 4, each of the oscillator cores C1 to C8 for example receives the same control voltage Vctrl, generated by a control circuit similar to the circuit 128 of FIG. 1.

Like for the embodiment of FIG. 7, the excitation circuits 102 of the oscillator cores C1 to C8 of the VCO 400 could instead be positioned close to the mid-points of the sides of the octagon-shaped common inductive loop 410, and the inductive portions 406, 408 of a given oscillator core could be formed adjacent to a same side of the octagon-shaped common inductive loop 410. In such an arrangement, the output lines 418, 422 would for example be positioned at one of the vertices of the common inductive loop 410, and the common-mode connection 426 would for example be positioned at the opposite vertex, which is for example at exactly the middle of the common inductive loop 410.

Furthermore, it would be possible to remove one or more oscillator cores from the VCO 400. For example, a solution based on six oscillator cores could be achieved by removing the cores C1 and C2.

While the embodiments of FIGS. 1, 4 and 7 illustrate examples with four and eight oscillator cores respectively, more generally, there could be M cores, where M is equal to two or more. In some embodiments, M can be an odd integer. The gain in terms of phase noise reduction can be shown to be equal to $10*Log10M$ dB when all cores are active. Thus the gain in the example of FIGS. 1, 4 and 7 with M=4 is for example 6 dB of phase noise reduction, and the gain in the example of FIG. 4 with M=8 is for example 9 dB of phase noise reduction. In the case of an odd number of cores, the common mode connection is for example coupled to the vertex opposite to the side on which the output lines of the VCO are formed and in particular at the middle of the inductive loop.

Figure 8:
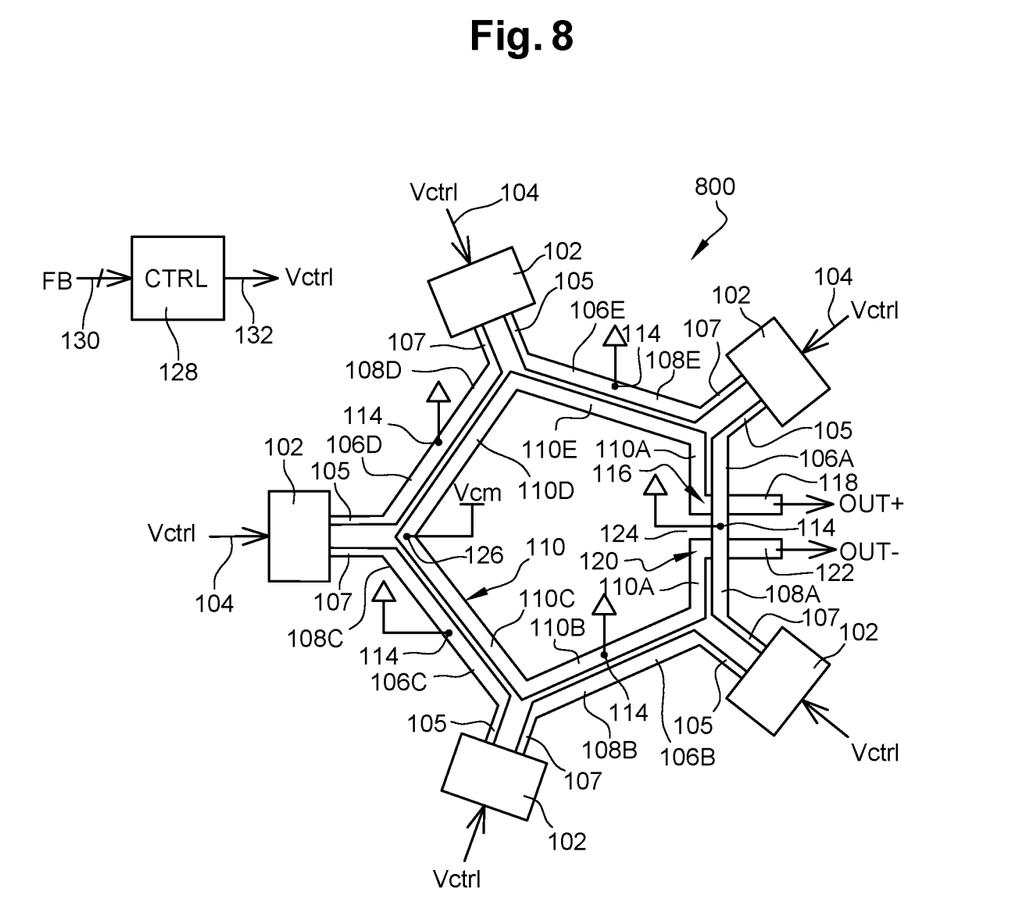
FIG. 8 schematically illustrates a VCO according to yet a further example embodiment of the present disclosure.

FIG. 8 illustrates an example of a VCO 800 based on five cores magnetically coupled in series via a pentagon-shaped inductive loop 110. The features of FIG. 8 have been labelled with the same reference numerals as those of FIGS. 1 and 7 and will not be described again. However, in FIG. 8, there are additional references 106E, 108E and 110E to designate the portions forming the fifth side of the pentagon.

Furthermore, it would also be possible, in the embodiments of FIGS. 1 and 4, or more generally in embodiments with M oscillator cores magnetically coupled in series, to selectively activate only certain cores. For example some or all of the oscillator cores include the variant 210 of FIG. 2, as will now be described in more detail with reference to FIG. 5.

Figure 5:
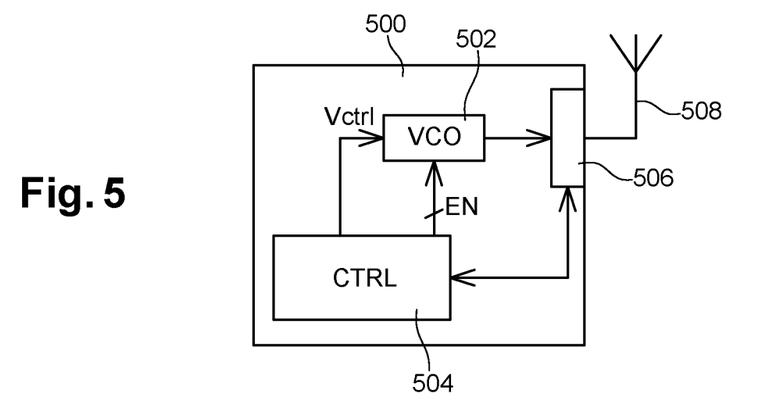
FIG. 5 schematically illustrates a wireless communications device comprising a VCO according to an example embodiment of the present disclosure.

FIG. 5 schematically illustrates a wireless communications device 500 comprising a VCO 502 according to an example embodiment of the present disclosure. The VCO 502 is for example implemented by the circuit of FIG. 1, 4, 7 or 8 or a similar circuit having M oscillator cores, wherein at least some of the cores can be selectively activated. The VCO 502 for example receives the control voltage Vctrl from a control circuit (CTRL) 504, and also an enable signal EN for each core capable of being selectively activated. An output signal from the VCO 502 is for example provided to an antenna circuit 506 coupled to an antenna 508. For example, this signal provides a carrier frequency for an RF transmission via the antenna 508.

In operation, initially all of the oscillator cores of the VCO 502 are for example active, such that a signal having a relatively low phase noise is for example transmitted using the antenna 508. The control circuit 504 then for example evaluates the channel quality. For example, one or more frames or packets known to a receiver are transmitted to the receiver, which is thus able to evaluate the channel, and return the obtained channel estimation to the transmitter and in particular to the control circuit 504. If the quality is relatively high, the transmission for example continues based on the activation of all of the oscillator cores such that a relatively high transmission data rate can be obtained. If, however, the channel quality is found to be relatively poor, one or more of the oscillator cores is for example deactivated. Indeed, this can allow power consumption to be reduced in cases where reduced phase noise will not significantly improve channel bandwidth.

Figure 6:
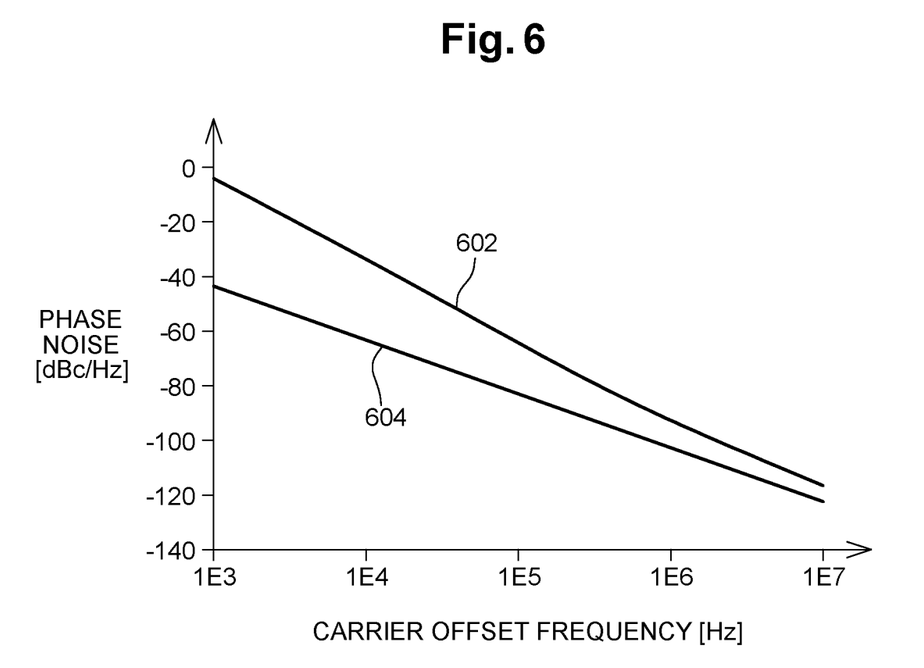
FIG. 6 is a graph representing phase noise as a function of carrier offset frequency.

FIG. 6 is a graph representing single sideband phase noise spectral density in dBc/Hz, as a function of the offset from the carrier frequency in Hz, where dBc is the phase noise amplitude level referred to the carrier per 1 Hz bandwidth. A curve 602 illustrates an example based on a VCO having one core, and a curve 604 illustrates an example based on a VCO like the one of FIG. 4 having 8 oscillator cores. In both cases, the VCOs were centered around the 60 GHz frequency range, and used BiCMOS transistor technology. It can be seen that 9 dB phase noise reduction is obtained at 1 MHz offset, where typically silicon based oscillators start to experience just the constant thermal noise effect (the curves of FIG. 6 are nearly parallel).

Advantages of the embodiments described herein is that the phase noise of a VCO is reduced while also providing a circuit arrangement that is feasible from a layout perspective. Furthermore, the addition of the oscillator core output signals leads to a differential output signal having relatively high amplitude, meaning in that in some cases amplification is not required. In some cases, an attenuator could be used to adjust the amplitude for a given application, while keeping the advantageously low phase noise.

Various embodiments and variants have been described. Those skilled in the art will understand that certain features of these embodiments can be combined and other variants will readily occur to those skilled in the art. In particular, while embodiments have been described in which a differential amplifier of the excitation circuit is connected or coupled to a ground rail, and inductive portions of the oscillator cores are connected or coupled to a positive supply rail, in alternative embodiments the supply voltages of the oscillator cores could be inverted.

Furthermore, while embodiments of VCOs have been described in relation with FIGS. 1, 4, 7 and 8 based on regular polygon shaped transformers having 4, 5 and 8 sides, the principles described in relation with these figures could be extended to VCO with transformers having any regular polygon shape.

Furthermore, while examples based on BiCMOS transistor technology have been described, it will be apparent to those skilled in the art that in alternative embodiments other transistor technologies, such as pure bipolar, or CMOS, could be used.

What is claimed is:

1. A voltage controlled oscillator comprising:
 a plurality of oscillator cores magnetically coupled in series, wherein:
  each oscillator core comprises first and second inductive portions that are magnetically coupled to a common inductive loop;
  a first end of each of the first and second inductive portions is coupled to an excitation circuit of the oscillator core; and
  a second end of each of the first and second inductive portions is coupled to a voltage supply rail; and
 the common inductive loop, comprising a common mode voltage connection at a mid-point along a first side of the common inductive loop or at a first vertex between two sides of the common inductive loop.

2. The voltage controlled oscillator of claim 1, wherein the plurality of oscillator cores comprises M oscillator cores, with M equal to 4 or more.

3. The voltage controlled oscillator of claim 1, further comprising a first output line coupled to one end of the common inductive loop and a second output line coupled to the other end of the common inductive loop.

4. The voltage controlled oscillator of claim 3, wherein the common inductive loop forms a regular polygon shape having at least four sides, and the first and second inductive portions are positioned adjacent to the sides of the common inductive loop.

5. The voltage controlled oscillator of claim 4, wherein each oscillator core has its first inductive portion positioned adjacent to a first side of the common inductive loop and its second inductive portion positioned adjacent to a second side of the common inductive loop.

6. The voltage controlled oscillator of claim 4, wherein the common inductive loop comprises:
 the first and second output lines coupled to a second side or a second vertex of the common inductive loop opposite to the first side or the first vertex, respectively.

7. The voltage controlled oscillator of claim 1, wherein each oscillator core comprises a varactor and a differential amplifier having a first output node coupled to the first end of the first inductive portion and a second output node coupled to the first end of the second inductive portion, the varactor being coupled between the first and second output nodes.

8. The voltage controlled oscillator of claim 1, wherein each oscillator core selectively activatable.

9. A communications device comprising:
 an antenna circuit configured to drive one or more antennas; and
 a voltage controlled oscillator coupled to the antenna circuit, the voltage controlled oscillator comprising:
  a plurality of oscillator cores magnetically coupled in series, wherein:
   each oscillator core comprises first and second inductive portions that are magnetically coupled to a common inductive loop;
   a first end of each of the first and second inductive portions is coupled to an excitation circuit of the oscillator core; and
   a second end of each of the first and second inductive portions is coupled to a voltage supply rail; and
  a common mode voltage connection at a mid-point along a first side of the common inductive loop or at a vertex between two sides of the common inductive loop.

10. The communications device of claim 9, wherein the plurality of oscillator cores comprises M oscillator cores, with M equal to 4 or more.

11. The communications device of claim 9, further comprising a first output line coupled to one end of the common inductive loop and a second output line coupled to the other end of the common inductive loop.

12. The communications device of claim 11, wherein the common inductive loop forms a regular polygon shape having at least four sides, and the first and second inductive portions are positioned adjacent to the sides of the common inductive loop.

13. The communications device of claim 12, wherein each oscillator core has its first inductive portion positioned adjacent to a first side of the common inductive loop and its second inductive portion positioned adjacent to a second side of the common inductive loop.

14. The communications device of claim 12, wherein the common inductive loop comprises:
 the first and second output lines coupled to a second side of the common inductive loop opposite to the first side.

15. The communications device of claim 9, wherein each oscillator core comprises a varactor and a differential amplifier having a first output node coupled to the first end of the first inductive portion and a second output node coupled to the first end of the second inductive portion, the varactor being coupled between the first and second output nodes.

16. The communications device of claim 9, further comprising a control circuit coupled to the voltage controlled oscillator, the control circuit configured to provide a respective enable signal to each oscillator core.

17. The communications device of claim 9, further comprising a control circuit coupled to the voltage controlled oscillator, the control circuit configured to provide a control voltage to each of the plurality of oscillator cores.

18. The communications device of claim 17, wherein the control circuit is further coupled to the antenna circuit.

19. The voltage controlled oscillator of claim 1, wherein the common inductive loop forms a regular polygon shape having at least four sides, and the first and second inductive portions are positioned adjacent to the sides of the common inductive loop.

20. The communications device of claim 9, wherein the common inductive loop forms a regular polygon shape having at least four sides, and the first and second inductive portions are positioned adjacent to the sides of the common inductive loop.

* * * * *